(12) United States Patent
Pinkelman et al.

(10) Patent No.: US 12,119,149 B2
(45) Date of Patent: Oct. 15, 2024

(54) FLUID TRANSPORT SYSTEMS COMPRISING A MAGNETIC SHAPE MEMORY PIPE

(71) Applicant: Toyota Motor Engineering & Manufacturing North America, Inc., Plano, TX (US)

(72) Inventors: Brian J. Pinkelman, Ann Arbor, MI (US); Michael P. Rowe, Pinckney, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 1394 days.

(21) Appl. No.: 16/659,833

(22) Filed: Oct. 22, 2019

(65) Prior Publication Data
US 2021/0118597 A1 Apr. 22, 2021

(51) Int. Cl.
| | |
|---|---|
| G01R 33/24 | (2006.01) |
| F04B 43/08 | (2006.01) |
| G01R 33/12 | (2006.01) |
| H01F 1/03 | (2006.01) |
| F04B 17/03 | (2006.01) |
| H01F 1/01 | (2006.01) |

(52) U.S. Cl.
CPC ......... H01F 1/0308 (2013.01); F04B 43/082 (2013.01); G01R 33/1207 (2013.01); G01R 33/24 (2013.01); F04B 17/03 (2013.01); H01F 1/015 (2013.01)

(58) Field of Classification Search
CPC ...... H01F 1/0308; H01F 1/015; F04B 43/082; F04B 17/03; F04B 43/08; F04B 43/09; F04B 43/12; G01R 33/1207; G01R 33/24; H10N 35/00
See application file for complete search history.

(56) References Cited

U.S. PATENT DOCUMENTS

| | | | | |
|---|---|---|---|---|
| 4,333,197 | A * | 6/1982 | Kuris | A61C 17/3481 |
| | | | | 433/119 |
| 6,886,331 | B2 | 5/2005 | Joshi | |
| 9,819,287 | B2 | 11/2017 | Mullner | |
| 2004/0011730 | A1* | 1/2004 | Powell | B01D 29/94 |
| | | | | 210/411 |
| 2014/0027108 | A1* | 1/2014 | Lopez | E21B 43/108 |
| | | | | 166/207 |
| 2015/0118077 | A1 | 4/2015 | Humburg | |
| 2015/0192218 | A1* | 7/2015 | Arend | F16K 31/0679 |
| | | | | 310/38 |

(Continued)

Primary Examiner — Shawki S Ismail
Assistant Examiner — Lisa N Homza
(74) Attorney, Agent, or Firm — Dinsmore & Shohl LLP

(57) ABSTRACT

A fluid transport system that includes a magnetic shape memory pipe having an input end opposite an output end and an outer surface opposite an inner surface. The inner surface defines an inner diameter of the magnetic shape memory pipe and the magnetic shape memory pipe includes a magnetic shape memory alloy. The fluid transport system further includes one or more magnetic field generating devices surrounding the outer surface of the magnetic shape memory pipe and configured to generate a control magnetic field that, when applied to a region of the magnetic shape memory pipe, alters the inner diameter of the region of the magnetic shape memory pipe.

20 Claims, 6 Drawing Sheets

(56) References Cited

U.S. PATENT DOCUMENTS

| | | | |
|---|---|---|---|
| 2016/0087553 A1* | 3/2016 | Müllner | F04B 17/03 |
| | | | 335/215 |
| 2016/0211065 A1 | 7/2016 | Mullner | |
| 2016/0369784 A1* | 12/2016 | Brown | F03G 7/06145 |
| 2017/0096989 A1 | 4/2017 | Humburg | |
| 2018/0021775 A1 | 1/2018 | Lindquist | |
| 2020/0303622 A1* | 9/2020 | Schnetzler | H10N 35/00 |

\* cited by examiner

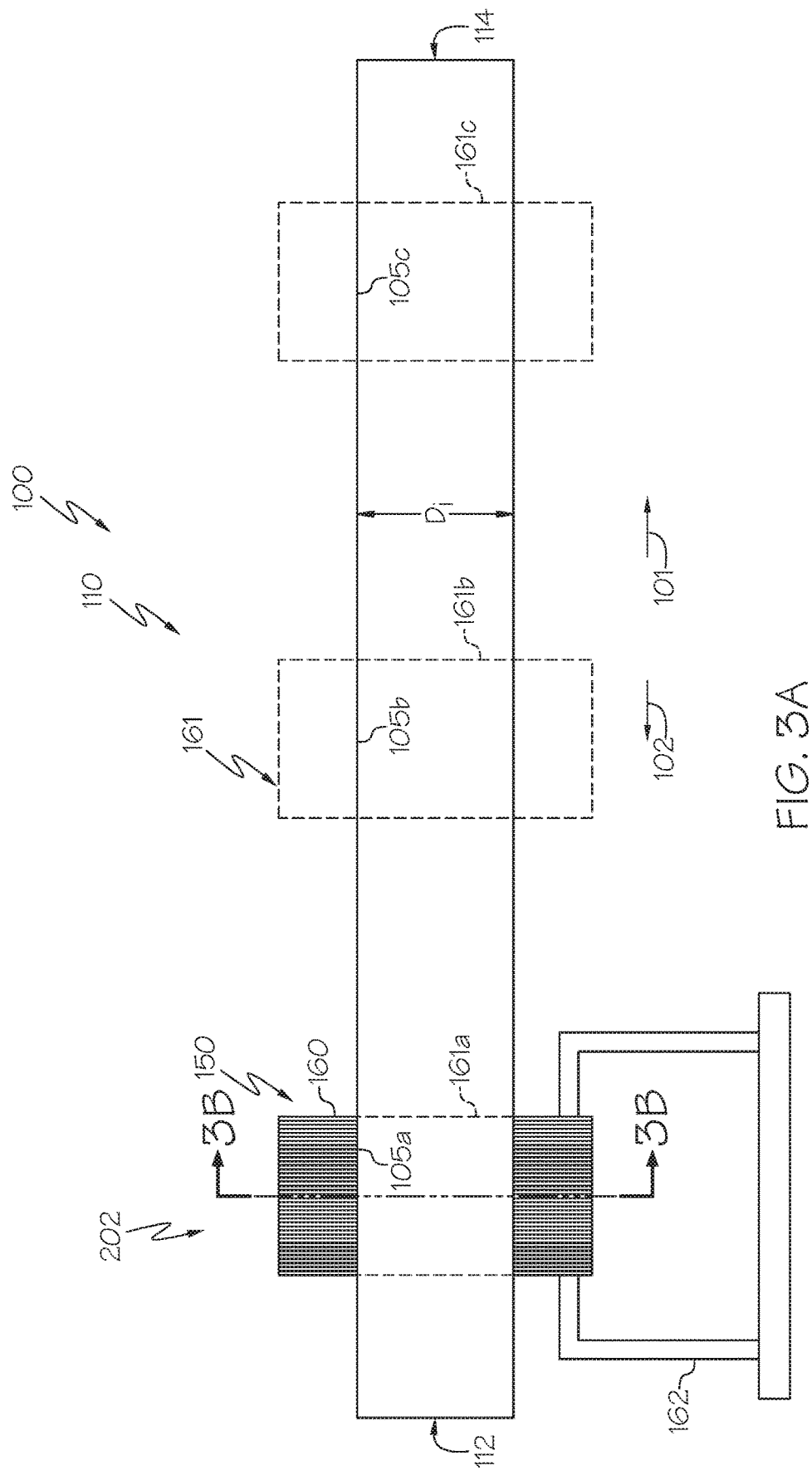

FLUID TRANSPORT SYSTEMS COMPRISING A MAGNETIC SHAPE MEMORY PIPE

TECHNICAL FIELD

The present specification generally relates to fluid transport systems that include pipes comprising a magnetic shape memory alloy and magnetic field generating devices surrounding the pipe.

BACKGROUND

Moving fluid through a pipe typically requires one or more external pumps fluidly coupled to the pipe, which operate by managing and altering the pressure in the pipe. Fluid flow is often desired in devices and systems with having small form factors, for example, cooling systems for power electronics devices. However, external pumps require additional space and are often not suitable for the size restraints in these small form factor systems.

Accordingly, a need exists for alternative fluid transport systems capable of generating fluid flow without the use of an external pump.

SUMMARY

In one embodiment, a fluid transport system includes a magnetic shape memory pipe having an input end opposite an output end and an outer surface opposite an inner surface. The inner surface defines an inner diameter of the magnetic shape memory pipe and the magnetic shape memory pipe includes a magnetic shape memory alloy. The fluid transport system further includes one or more magnetic field generating devices surrounding the outer surface of the magnetic shape memory pipe and configured to generate a control magnetic field that, when applied to a region of the magnetic shape memory pipe, alters the inner diameter of the region of the magnetic shape memory pipe.

In another embodiment, a method of transporting fluid includes introducing a fluid into an input end of a magnetic shape memory pipe. The magnetic shape memory pipe includes the input end opposite an output end and an outer surface opposite an inner surface. The inner surface defines an inner diameter of the magnetic shape memory pipe. Further, the magnetic shape memory pipe includes a magnetic shape memory alloy. The method also includes applying a control magnetic field to a first region of the magnetic shape memory pipe such that the magnetic shape memory alloy in the first region of the magnetic shape memory pipe changes from a static state to a contracted state, thereby increasing the inner diameter of the first region of the magnetic shape memory pipe from a first inner diameter to a second inner diameter and encouraging fluid flow from the input end of the magnetic shape memory pipe toward the output end of the magnetic shape memory pipe. The control magnetic field is generated using one or more magnetic field generating devices surrounding the outer surface of the magnetic shape memory pipe.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 3A schematically depicts a magnetic shape memory pipe and a magnetic field generating device comprising a toroidal magnetic device, according to one or more embodiments shown and described herein;

DETAILED DESCRIPTION

Figure 1:
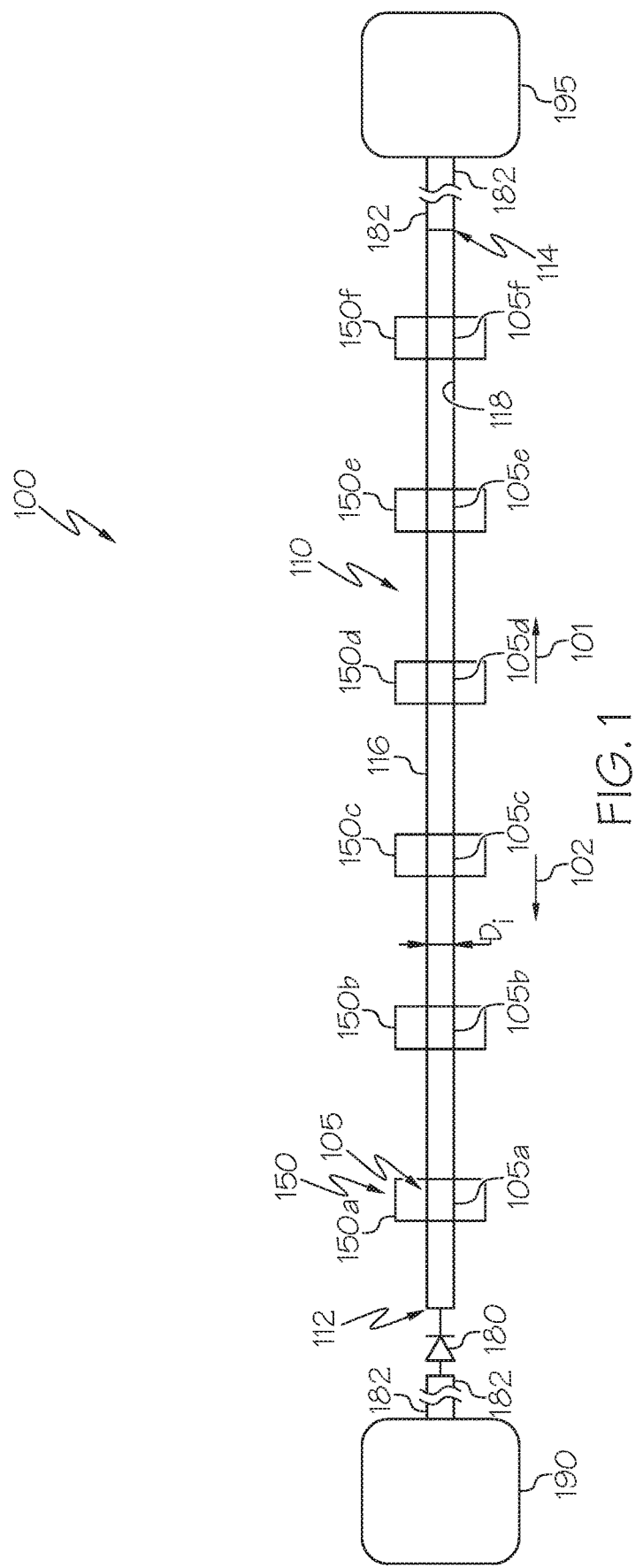
FIG. 1 schematically depicts fluid transport system comprising a magnetic shape memory pipe and one or more magnetic field generating devices, according to one or more embodiments shown and described herein.

Referring generally to the figures, embodiments of the present disclosure are directed to fluid transport systems that include a magnetic shape memory (MSM) pipe and one or more magnetic field generating devices. The MSM pipe comprises a MSM alloy configured to contract and/or expand based on the presence of a control magnetic field generated by the one or more magnetic field generating devices. This contraction and expansion of the MSM alloy, and thereby an inner diameter of the MSM pipe, generates a peristaltic pumping action through the MSM pipe. In particular, selective application of the control magnetic field alters the inner diameter of a region MSM pipe, increasing and decreasing the local pressure in this region to encourage fluid flow in the MSM pipe without external pumps, minimizing the footprint of the fluid transport system and providing improved control over fluid flow and pressure. Embodiments of fluid transport systems comprising an MSM pipe and one or more magnetic field generating devices will now be described and, whenever possible, the same reference numerals will be used throughout the drawings to refer to the same or like parts.

Figure 2A:
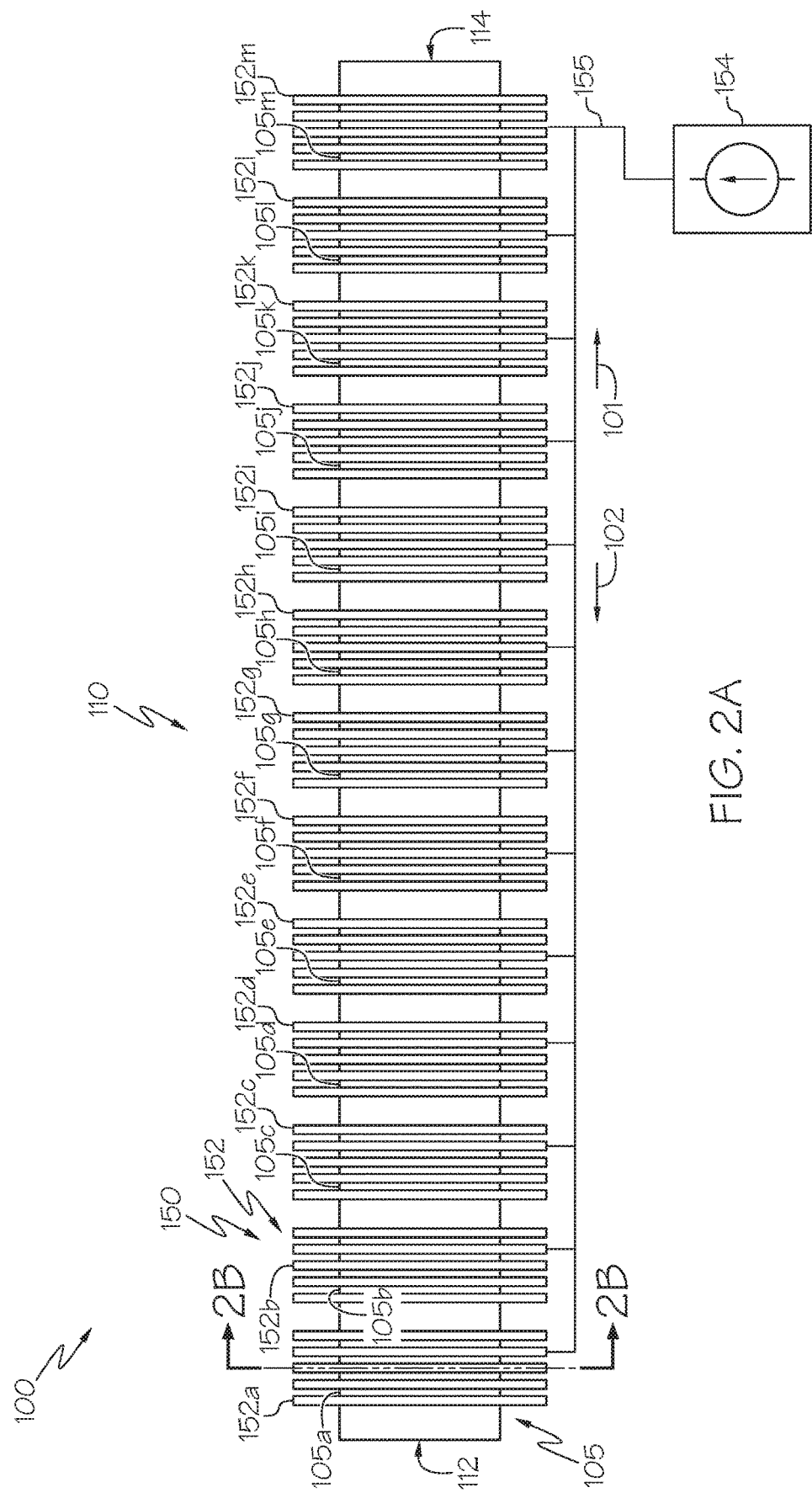
FIG. 2A schematically depicts a magnetic shape memory pipe and a plurality of magnetic field generating devices comprising wire coil sections, according to one or more embodiments shown and described herein.
Figure 2B:
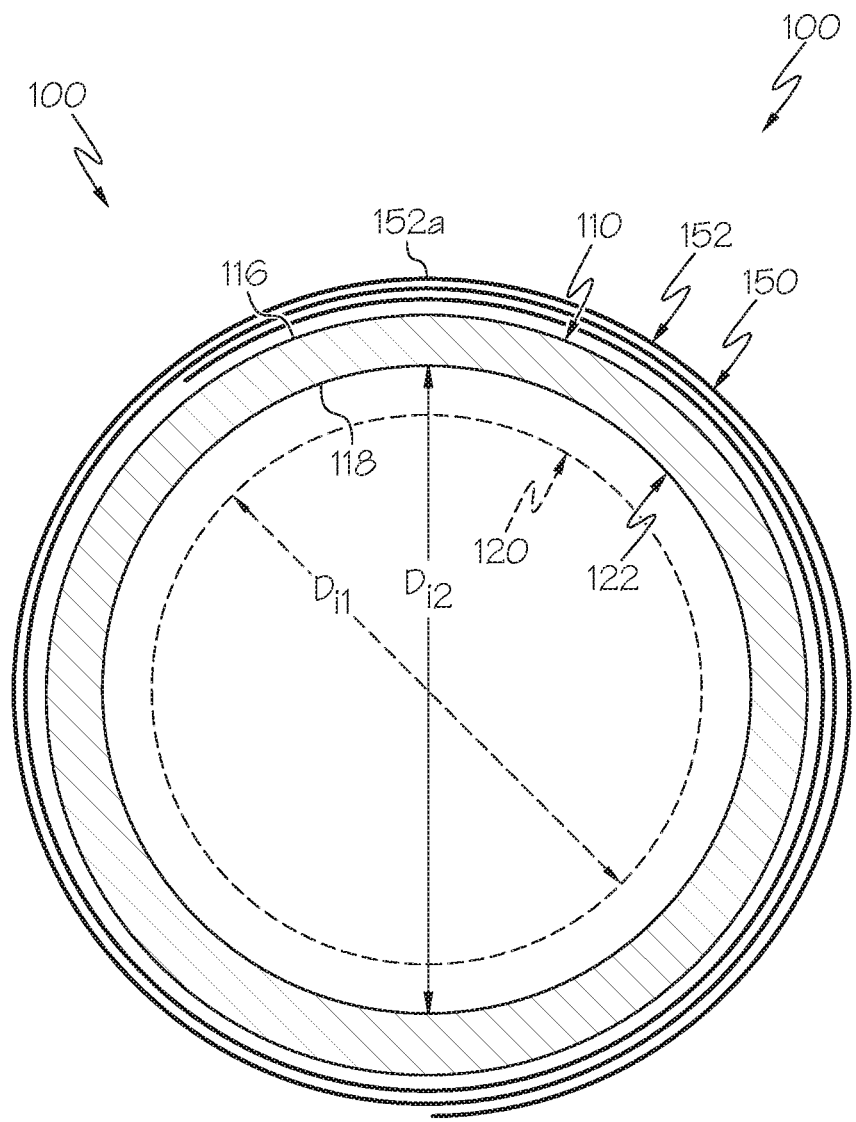
FIG. 2B schematically depicts a cross section along line 2B-2B of the magnetic shape memory pipe and an individual wire coil section of FIG. 2A, according to one or more embodiments shown and described herein.

Referring now to FIG. 1, a fluid transport system 100 comprising a magnetic shape memory (MSM) pipe 110 and one or more magnetic field generating devices 150 is schematically depicted. The MSM pipe 110 comprises an input end 112 opposite an output end 114 and an outer surface 116 opposite an inner surface 118. The inner surface 118 defines an inner diameter $D_i$ of the MSM pipe 110 and the one or more magnetic field generating devices 150 surround the outer surface 116 of the MSM pipe 110. In some embodiments, as shown in FIGS. 2A and 2B, the one or more magnetic field generating devices 150 comprise a plurality of wire coil sections 152 wrapped around the MSM pipe 110 and disposed along the length of the MSM pipe 110. In other embodiments, as shown FIGS. 3A-3B, the one or more magnetic field generating devices 150 comprise a toroidal magnetic device 160 surrounding the MSM pipe 110 and translatable along the length of the MSM pipe 110.

The MSM pipe 110 comprises an MSM alloy, for example, a nickel-manganese-gallium (Ni—Mn—Ga), an iron-palladium alloy (Fe—Pd), a nickel-iron-gallium alloy (Ni—Fe—Ga), or the like. An MSM alloy is a shape memory alloy that deforms in response to a magnetic field. Without intending the be limited by theory, an MSM alloy comprises a martensite crystalline structure that undergoes magnetic field-induced reorientation when exposed to a magnetic field equal to or greater than a threshold magnetic flux. In the embodiments described herein, this magnetic field reorientation of the martensite crystalline structure of the MSM alloy of the MSM pipe 110 contracts the MSM alloy, thereby increasing the inner diameter Di of the MSM pipe 110.

In particular, the MSM alloy (and thereby the MSM pipe 110) is alterable between a static state 120 and a contracted state 122. The MSM alloy is in the static state 120 when not exposed to a magnetic field with a magnetic flux greater than or equal to the threshold magnetic flux. Conversely, the MSM alloy is in the contracted state 122 when exposed to a magnetic field with a magnetic flux greater than or equal to the threshold magnetic flux. In some embodiments, the threshold magnetic flux is from 0.5 tesla to 10 tesla, for example, 1 tesla to 5 tesla, 1 tesla to 3 tesla, or the like. Furthermore, when the MSM alloy is in the static state 120, the inner diameter a of the MSM pipe comprises a first inner diameter $D_{i1}$ and when the MSM alloy is in the contracted state 122, the inner diameter $D_i$ of the MSM pipe 110 increases to a second inner diameter $D_{i2}$, which is larger than the first inner diameter $D_{i1}$. The second inner diameter $D_{i2}$ may be 5% to 10% larger than the first inner diameter $D_{i1}$, for example, 6%, 7%, 8%, 9%, or the like. In other words, the MSM alloy contracts by 5% to 10% when exposed to a magnetic flux greater than or equal to the threshold magnetic flux.

Referring again to FIG. 1, the MSM pipe 110 comprises a plurality of regions 105 each comprising any contiguous segment of the MSM pipe 110. For example, FIG. 1 depicts six regions 105a-105f. However, it should be understood that the MSM pipe 110 may comprise any number of regions 105. Indeed, it should be understood that the segmentation of the MSM pipe 110 into regions 105 is described herein for ease of understanding the operation of the fluid transport system 100, in particular, for ease of understanding the selective alteration of the inner diameter $D_i$ of the MSM pipe 110.

In operation, the one or more magnetic field generating devices 150 are configured to selectively apply a control magnetic field to an individual region 105 of the MSM pipe 110 to reorient the MSM alloy of the MSM pipe 110 into the contracted state 122 and increase the inner diameter $D_i$ of the individual region 105 of the MSM pipe 110. As used herein, a "control magnetic field" is a magnetic field that, when applied to the MSM pipe 110, increases the total magnetic flux applied to the MSM pipe 110 to greater than or equal to the threshold magnetic flux. In some embodiments, the control magnetic field comprises a magnetic flux that is greater than or equal to the threshold magnetic flux. In other embodiments, for example, embodiments in which a secondary magnetic field is also applied to the MSM pipe 110, such as a support magnetic field generated by a magnetic tube 140 (FIG. 4), the control magnetic field may comprise a magnetic flux that is less than the threshold magnetic flux but, when added to the secondary magnetic field, contributes to a collective application of a magnetic flux that is greater than or equal to the threshold magnetic flux.

The fluid transport system 100 may be used to transport fluid, for example, from a fluid source 190 into and through the MSM pipe 110 using a peristaltic pumping action in the MSM pipe 110. In particular, selective application of the control magnetic field generated by the one or more magnetic field generating devices 150 may locally increase (and thereafter decrease) the inner diameter $D_i$ of different regions 105 (i.e., sequential, adjacently positioned regions) of the MSM pipe 110, which creates a wave action as the inner diameter Di of regions 105 of the MSM pipe 110 increase and subsequently decrease, altering local pressure and pushing fluid through the MSM pipe 110 in a fluid flow direction 101, without the use of an external, additional pump.

Referring still to FIG. 1, the fluid source 190 is fluidly coupled to the input end 112 of the MSM pipe 110 and a fluid reservoir 195 is fluidly coupled to the output end 114 of the MSM pipe 110. The fluid source 190 may be fluidly coupled to the input end 112 of the MSM pipe 110 directly or using one or more transport pipes 182, which may comprise any piping material and are not limited to MSM material based pipes. Similarly, the fluid reservoir 195 is fluidly coupled to the output end 114 of the MSM pipe 110 directly or using one or more transport pipes 182. As depicted in FIG. 1, the fluid transport system 100 may further comprise a check valve 180 fluidly coupled to the input end 112 of the MSM pipe 110, for example, positioned between the fluid source 190 and the input end 112 of the MSM pipe 110. In operation, the check valve 180 prevents fluid from flowing beyond the check valve 180 in a reverse direction 102 and mitigates fluid flow in the reverse direction 102 throughout the length of the MSM pipe 110.

Referring now to FIG. 2A, an embodiment of the fluid transport system 100 in which the one or more magnetic field generating devices 150 comprise the plurality of wire coil sections 152 is depicted. The plurality of wire coil sections 152 are periodically disposed along the length of the MSM pipe 110, for example, at equal intervals along the length of the MSM pipe 110. Individual wire coil sections (152a-152m) of the plurality of wire coil sections 152 are wrapped around the MSM pipe 110 at individual regions 105 of the MSM pipe 110. As an illustrative example, the plurality of wire coil sections 152 depicted in FIG. 2A comprise thirteen wire coil segments 152a-152m wrapped around thirteen regions 105a-105m of the MSM pipe 110. However, it should be understood that any number of wire coil sections 152 are contemplated. For example, the number of wire coil sections 152 may be determined based on the length of the MSM pipe 110 and the spacing between each wire coil section 152.

Furthermore, the plurality of wire coil sections 152 are electrically coupled to one or more current sources 154 by one or more electrical pathways 155. Thus, each of the plurality of wire coil sections 152 may operate as an electromagnet. In particular, when the one or more current sources 154 apply current to an individual wire coil section of the plurality of wire coil sections 152, the individual wire coil section generates the control magnetic field. Some embodiments may comprise a single current source 154, such that each of the plurality of wire coil sections 152 are electrically coupled to the single current source 154, as depicted in FIG. 2A. Other embodiments may comprise multiple current sources 154 and each current source 154 may be electrically coupled to an individual one of the plurality of wire coil sections 152 or a subset of the plurality of wire coil sections 152.

Referring now to FIG. 2B, a cross-sectional view of the fluid transport system 100 taken along line 2B-2B is schematically depicted. In particular, FIG. 2B is a cross section of the first region 105a of the MSM pipe 110 and the first wire coil section 152a. FIG. 2B also shows that in the static state 120, the first region 105a of the MSM pipe 110 comprises the first inner diameter $D_{i1}$ and in the contracted state 122, the first region 105a of the MSM pipe 110 comprises the second inner diameter $D_{i2}$. In operation, the first region 105a of the MSM pipe 110 is in the contracted state 122 when the first wire coil section 152a receives current and generates a control magnetic field. While the embodiment depicted in FIGS. 2A and 2B includes a plurality of wire coil sections 152, in an alternative embodiment, the one or more magnetic field generating devices 150 may comprise a single continuous magnetic coil extending along the length of the MSM pipe 110. In this alternative embodiment, the current source 154 may provide current to selective portions of this continuous magnetic coil such that the control magnetic field may be generated at these selective portions to contract the MSM pipe 110 at the regions 105 of the MSM pipe 110 around which these selective portions of the continuous magnetic coil are located.

Referring now to FIG. 3A, an embodiment of the fluid transport system 100 in which the one or more magnetic field generating devices 150 comprise the toroidal magnetic device 160 is depicted. The toroidal magnetic device 160 may comprise any magnetic device with a toroidal shape (i.e., a ring or donut shape). For example, in some embodiments, the toroidal magnetic device 160 may comprise a toroidal magnetic core comprising ferromagnetic material, magnetite, lodestone, an alnico iron alloy, gadolinium, dysprosium, ferrite, or the like, and a wire coil (similar to the plurality wire coils sections 152 of FIGS. 2A and 2B) wrapped around the magnetic core. In this embodiment, the wire coil of the toroidal magnetic device 160 may be electrically coupled to a current source (such as the current source 154 of FIG. 2A). As depicted in FIG. 3A, the toroidal magnetic device 160 is coupled to a linear translation device 162. The linear translation device 162 may comprise any device or system configured to move the toroidal magnetic device 160 along the length of the MSM pipe 110, for example, an arm coupled to a track extending along the length of the MSM pipe 110.

In operation, the linear translation device 162 may move the toroidal magnetic device 160 between a plurality of positions 161, each located at a region 105 of the MSM pipe 110. As an illustrative example, FIG. 3A depicts a first position 161a at the first region 105a of the MSM pipe 110, a second position 161b at the second region 105b of the MSM pipe 110, and a third position 161c at the third region 105c. In FIG. 3A, the toroidal magnetic device 160 is located in the first position 161a such that the toroidal magnetic device 160 may apply the control magnetic field to the first region 105a of the MSM pipe 110. Moving the toroidal magnetic device 160 to different positions 161 facilitates the application of the control magnetic field to different regions 105 of the MSM pipe 110.

Figure 3B:
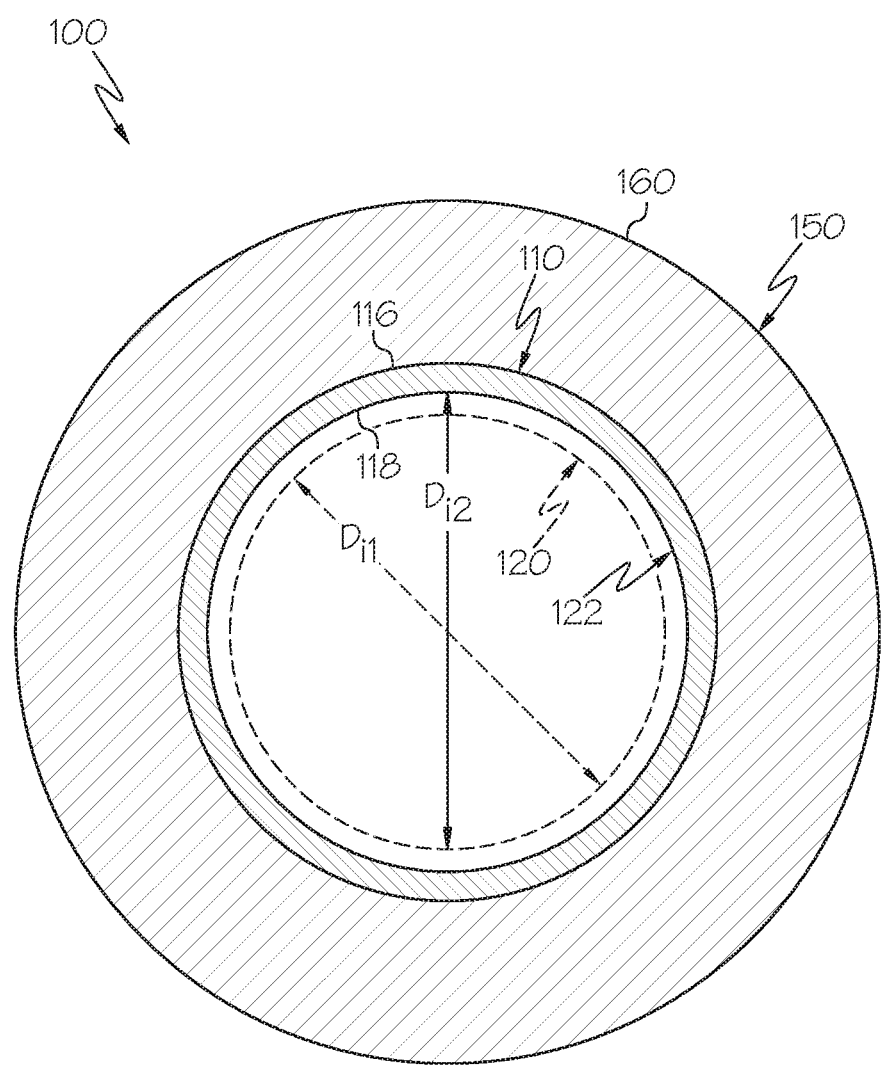
FIG. 3B schematically depicts a cross section along line 3B-3B of the magnetic shape memory pipe and the toroidal magnetic device of FIG. 3A, according to one or more embodiments shown and described herein.

Referring now to FIG. 3B, a cross-sectional view of the fluid transport system 100 taken along line 3B-3B is schematically depicted. In particular, FIG. 3B depicts a cross-section of the first region 105a of the MSM pipe 110 and the toroidal magnetic device 160, which is located in the first position 161a. FIG. 3B also shows that in the static state 120, the first region 105a of the MSM pipe 110 comprises the first inner diameter $D_{i1}$ and in the contracted state 122, the first region 105a of the MSM pipe 110 comprises the second inner diameter $D_{i2}$. In operation, the first region 105a of the MSM pipe 110 is in the contracted state 122 when the toroidal magnetic device 160 is positioned at the first region 105a (e.g., located in the first position 161a).

Figure 4:
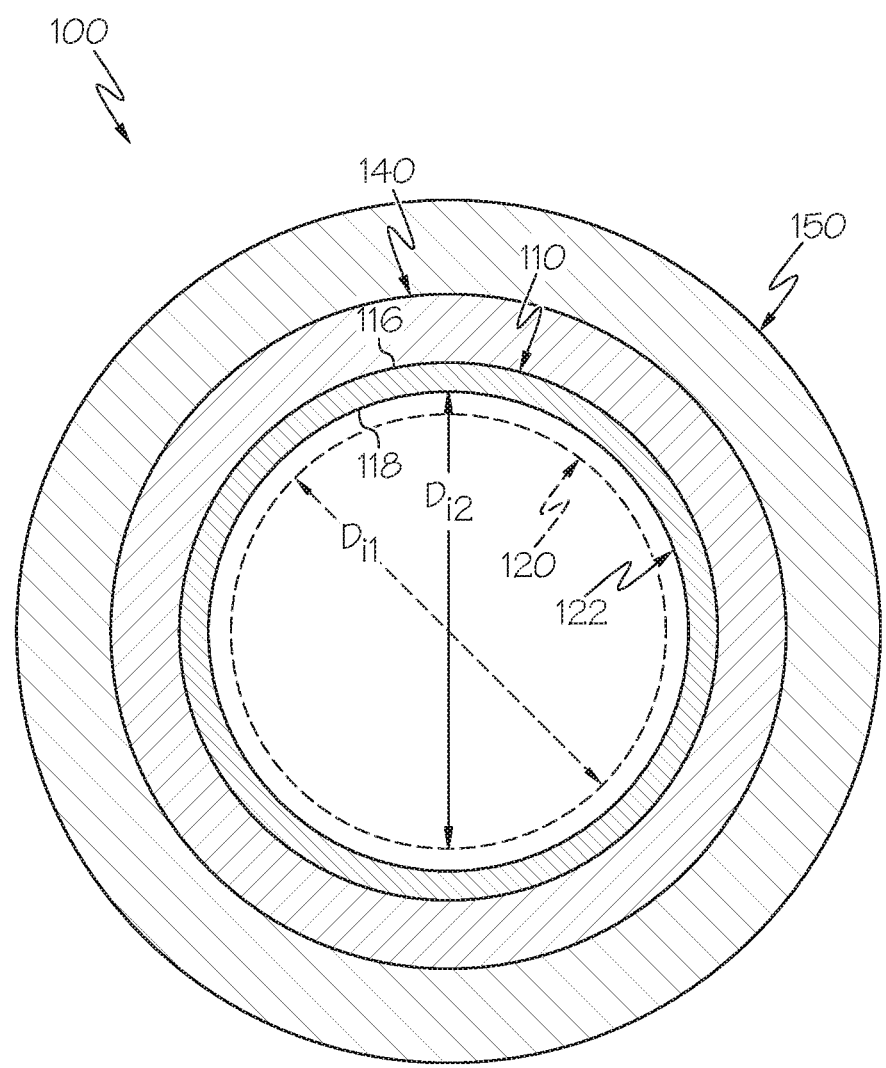
FIG. 4 schematically depicts a cross sectional view of an embodiment of the fluid transport system including a magnetic tube positioned between a magnetic shape memory pipe and a magnetic field generating device, according to one or more embodiments shown and described herein.

Referring now to FIG. 4, in some embodiments, the fluid transport system 100 may further comprise a magnetic tube 140 surrounding the MSM pipe 110 and positioned between the MSM pipe 110 and the one or more magnetic field generating devices 150. In some embodiments, the magnetic tube 140 comprises a permanent magnet, such as a paramagnetic material or a ferromagnetic material. Example materials of the magnetic tube 140 include magnetite, lodestone, an alnico iron alloy, gadolinium, dysprosium, ferrite, or the like. It should be understood that the magnetic tube 140 may comprise any magnetic material. In operation, the magnetic tube 140 generates a continuous support magnetic field along the length of the MSM pipe 110. In the embodiments described herein, the magnetic flux of the support magnetic field generated by the magnetic tube 140 is less than the threshold magnetic flux. However, by applying a magnetic flux to the MSM pipe 110 that is less than the threshold magnetic flux, the one or more magnetic field generating devices 150 are required to generate a lower magnetic flux control magnetic field to collectively (with the support magnetic field) apply a magnetic flux that is greater than or equal to the threshold magnetic flux and place the MSM alloy into the contracted state 122 to increase the inner diameter $D_i$ of the MSM pipe 110.

Referring now to FIGS. 1-4, a method of transporting fluid using the fluid transport system 100 may comprise introducing a fluid into the input end 112 of the MSM pipe 110, for example, from the fluid source 190 fluidly coupled to the MSM pipe 110. Next, the method comprises applying the control magnetic field to the first region 105a of the MSM pipe using the one or more magnetic field generating devices 150. The control magnetic field, alone or in combination with a support magnetic field generated by the magnetic tube 140, applies a magnetic flux that is greater than or equal to the threshold magnetic flux to the first region 105a of the MSM pipe 110 and causes the MSM alloy in the first region 105a to change from the static state 120 to the contracted state 122. This increases the inner diameter $D_i$ of the first region 105a of the MSM pipe from the first inner diameter $D_{i1}$ to the second inner diameter $D_{i2}$, which encourages fluid flow from the input end 112 of the MSM pipe to the first region 105a (e.g., in the fluid flow direction 101 toward the output end 114 of the MSM pipe 110) based on the pressure change induced by the increased diameter of the first region 105a of the MSM pipe 110.

Next, the method comprises removing the control magnetic field from the first region 105a of the MSM pipe 110 such that the MSM alloy of the first region 105a changes from the contracted state 122 back to the static state 120, thereby decreasing the inner diameter of the first region 105a of the MSM pipe from the second inner diameter $D_{i2}$ back to the first inner diameter $D_{i1}$. This inner diameter $D_i$ decrease in the first region 105a encourages fluid flow from the first region 105a of the MSM pipe 110 in the fluid flow direction 101 toward the output end 114 of the MSM pipe 110 based on the pressure change induced by the decreased inner diameter $D_i$ of the first region 105a of the MSM pipe 110.

Subsequent to removing the control magnetic field from the first region 105a of the MSM pipe 110, the method includes applying the control magnetic field to a second region 105*b* of the MSM pipe 110 using the one or more magnetic field generating devices 150. The control magnetic field, alone or in combination with a support magnetic field generated by the magnetic tube 140, applies a magnetic flux that is greater than or equal to the threshold magnetic flux to the second region 105*b* of the MSM pipe 110 and causes the MSM alloy in the second region 105*b* to change from the static state 120 to the contracted state 122. This increases the inner diameter $D_i$ of the second region 105*b* of the MSM pipe 110 from the first inner diameter $D_{i1}$ to the second inner diameter $D_{i2}$, which encourages fluid flow from the first region 105*a* to the second region 105*b* (e.g., in the fluid flow direction 101 toward the output end 114 of the MSM pipe 110) based on the pressure change induced by the increased diameter of the second region 105*b* of the MSM pipe 110.

Furthermore, in some embodiments, the method next includes removing the control magnetic field from the second region 105*b* of the MSM pipe 110 such that the MSM alloy of the second region 105*b* changes from the contracted state 122 back to the static state 120, thereby decreasing the inner diameter $D_i$ of the second region 105*b* of the MSM pipe 110 from the second inner diameter $D_{i2}$ back to the first inner diameter $D_{i1}$. This inner diameter $D_i$ decrease in the second region 105*b* encourages fluid flow from the second region 105*b* of the MSM pipe 110 in the fluid flow direction 101 toward the output end 114 of the MSM pipe 110 based on the pressure change induced by the decreased diameter of the second region 105*b* of the MSM pipe 110.

Subsequent to removing the control magnetic field from the second region 105*b* of the MSM pipe 110, the method includes applying the control magnetic field to the third region 105*c* of the MSM pipe 110 using the one or more magnetic field generating devices 150. The control magnetic field, alone or in combination with a support magnetic field generated by the magnetic tube 140, applies a magnetic flux that is greater than or equal to the threshold magnetic flux to the third region 105*c* of the MSM pipe 110 and causes the MSM alloy in the third region 105*c* to change from the static state 120 to the contracted state 122. This increases the inner diameter $D_i$ of the third region 105*c* of the MSM pipe 110 from the first inner diameter $D_{i1}$ to the second inner diameter $D_{i2}$, which encourages fluid flow from the second region 105*b* to the third region 105*c* (e.g., in the fluid flow direction 101 toward the output end 114 of the MSM pipe 110) based on the pressure change induced by the increased diameter of the third region 105*c* of the MSM pipe 110.

The process of applying and removing the control magnetic field to adjacently positioned regions 105 of the MSM pipe 110 may continue in the fluid flow direction 101 from the input end 112 to the output end 114 of the MSM pipe 110, increasing and subsequently decreasing the inner diameter $D_i$ in regions 105 of the MSM pipe 110 from the input end 112 to the output end 114 generating a wave action in the MSM pipe 110. After the application and removal of the control magnetic field from the region 105 of the MSM pipe 110 nearest the output end 114 of the MSM pipe 110, the process repeats and the control magnetic field is again applied to the first region 105*a* of the MSM pipe 110 and then to adjacently positioned regions 105.

In some embodiments, the control magnetic field is applied to one region 105 of the MSM pipe 110 at a time. However, in other embodiments, multiple control magnetic fields may be applied simultaneously. As an illustrative example, when the one or more magnetic field generating devices 150 (such as the plurality of wire coil sections 152) are applying a magnetic field to the third region 105*c* of the MSM pipe 110, they may also apply a control magnetic field to the first region 105*a* of the MSM pipe 110. Then, the two control magnetic fields may simultaneously be removed from the first region 105*a* and the third region 105*c*, respectively, and then may simultaneously be applied to the second region 105*b* and the fourth region 105*d*, respectively. This process of control magnetic field application and removal may continue in the fluid flow direction 101 thereby generating multiple, simultaneous wave actions in the fluid flow direction 101.

As depicted in FIGS. 2A and 2B, in embodiments in which the one or more magnetic field generating devices 150 comprise the plurality of wire coil sections 152 wrapped around the MSM pipe 110, applying the control magnetic field to the first region 105*a* of the MSM pipe 110 comprises applying a current generated by the one or more current sources 154 to the first wire coil section 152*a*, such that the first wire coil section 152*a* generates the control magnetic field. Further, applying the control magnetic field to the second region 105*b* of the MSM pipe 110 comprises applying a current generated by the one or more current sources 154 to the second wire coil section 152*b*, such that the second wire coil section 152*b* generates the control magnetic field. Still further, applying the control magnetic field to the third region 105*c* of the MSM pipe 110 comprises applying a current generated by the one or more current sources 154 to the third wire coil section 152*c*, such that the third wire coil section 152*c* generates the control magnetic field.

It should be understood that the application and subsequent removal of current to sequential adjacently positioned wire coil sections 152*a*-152*m* applies and removes the control magnetic field from sequential adjacently positioned regions 105*a*-105*m* of the MSM pipe 110 from the input end 112 to the output end 114 of the MSM pipe 110, i.e., in the fluid flow direction 101. This generates a wave action in the MSM pipe 110 as the inner diameter $D_i$ of regions 105 of the MSM pipe 110 increase and subsequently narrow back to their original inner diameter $D_i$ generating fluid flow in the fluid flow direction 101. Moreover, after the application and removal of the control magnetic field from the region 105 of the MSM pipe 110 nearest the output end 114 of the MSM pipe 110, the process repeats and the control magnetic field is again applied to the first region 105*a* of the MSM pipe 110.

As depicted in FIGS. 3A and 3B, in embodiments in which the one or more magnetic field generating devices 150 comprise the toroidal magnetic device 160 surrounding the MSM pipe 110, applying the control magnetic field to the first region 105*a* of the MSM pipe 110 comprises positioning the toroidal magnetic device 160 at the first region 105*a* of the MSM pipe. Further, applying the control magnetic field to the second region 105*b* of the MSM pipe 110 comprises translating the toroidal magnetic device 160 from the first region 105*a* of the MSM pipe 110 to the second region 105*b* of the MSM pipe 110, for example, using the linear translation device 162. Still further, applying the control magnetic field to the third region 105*c* of the MSM pipe 110 comprises translating the toroidal magnetic device 160 from the second region 105*b* of the MSM pipe 110 to the third region 105*c* of the MSM pipe 110, for example, using the linear translation device 162.

It should be understood that the translating the toroidal magnetic device 160 in the fluid flow direction 101 applies and removes the control magnetic field along the MSM pipe 110 from the input end 112 to the output end 114 of the MSM pipe 110 (for example, between adjacently positioned regions 105 in an intermittent or continuous translational motion). This generates a wave action in the MSM pipe 110 as the inner diameter $D_i$ of regions of the MSM pipe 110 increase and subsequently narrow back to their original inner diameter $D_i$ generating fluid flow in the fluid flow direction 101. Moreover, after the toroidal magnetic device 160 reaches the output end 114 of the MSM pipe 110, the linear translation device 162 may return the toroidal magnetic device 160 back to the input end 112 of the MSM pipe 110, for example, in a reverse direction 102. While returning the toroidal magnetic device 160 back to the input end 112 of the MSM pipe 110 in a reverse direction 102 may apply the control magnetic field along the MSM pipe 110 in the reverse direction 102, embodiments of the fluid transport system 100 that include the toroidal magnetic device 160 may further include the check valve 180, which limits and/or prevents fluid flow in the reverse direction 102. Once the toroidal magnetic device 160 reaches the input end 112 of the MSM pipe 110, the process may repeat and the toroidal magnetic device 160 may again be translated from the input end 112 to the output end 114 of the MSM pipe, thereby generating another wave action in the MSM pipe 110 as the inner diameter Di of regions of the MSM pipe 110 increase and subsequently narrow back to their original inner diameter $D_i$.

It should now be understood that embodiments described herein are directed to fluid transport systems that include an MSM pipe and one or more magnetic field generating devices that collectively operate as a peristaltic pump and generate fluid flow though the MSM pipe without the use of external pumps. The MSM pipe comprises a MSM alloy that alters its crystalline structure in the presence of a magnetic flux that is greater than or equal to a threshold magnetic flux. This structural alteration of MSM alloy contracts the MSM alloy and increases the inner diameter $D_i$ of the MSM pipe. Sequentially contracting and expanding regions of the MSM pipe from the input end to the output end of the MSM pipe through selective application of a control magnetic field generated by the one or more magnetic field generating devices alters the local pressure in these regions and encourages fluid flow without external pumps. This minimizes the footprint of the fluid transport system and provides improved control over fluid flow and pressure, particularly in small form-factor applications.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A fluid transport system comprising:
   a magnetic shape memory (MSM) pipe comprising an input end opposite an output end and an outer surface opposite an inner surface, wherein the inner surface defines an inner diameter of the MSM pipe and the MSM pipe comprises an MSM alloy; and
   one or more magnetic field generating devices surrounding the outer surface of the MSM pipe and configured to generate a control magnetic field that, when applied to a region of the MSM pipe, alters the inner diameter of the region of the MSM pipe.

2. The fluid transport system of claim 1, wherein:
   the MSM alloy is alterable between a static state and a contracted state;
   when the MSM alloy is in the static state, the inner diameter of the MSM pipe is a first inner diameter;
   when the MSM alloy is in the contracted state, the inner diameter of the MSM pipe is a second inner diameter; and
   the second inner diameter is larger than the first inner diameter.

3. The fluid transport system of claim 2, wherein the second inner diameter is from 5% to 10% larger than the first inner diameter.

4. The fluid transport system of claim 2, wherein the MSM alloy is in the contracted state when exposed to a magnetic flux that is greater than or equal to a threshold magnetic flux.

5. The fluid transport system of claim 4, wherein the control magnetic field comprises a magnetic flux that is greater than or equal to the threshold magnetic flux.

6. The fluid transport system of claim 1, wherein the MSM alloy comprises Ni—Mn—Ga.

7. The fluid transport system of claim 1, further comprising a magnetic tube surrounding the MSM pipe and positioned between the MSM pipe and the one or more magnetic field generating devices, wherein the magnetic tube is configured to generate a support magnetic field along a length of the MSM pipe.

8. The fluid transport system of claim 7, wherein:
   the MSM alloy is in a contracted state when exposed to a magnetic flux that is greater than or equal to a threshold magnetic flux; and
   the support magnetic field comprises a magnetic flux that 1s less than the threshold magnetic flux.

9. The fluid transport system of claim 1, wherein:
   the one or more magnetic field generating devices comprise a plurality of wire coil sections wrapped around the MSM pipe and disposed along a length of the MSM pipe; and
   the plurality of wire coil sections are electrically coupled to one or more current sources.

10. The fluid transport system of claim 9, wherein when the one or more current sources apply current to an individual wire coil section of the plurality of wire coil sections, the individual wire coil section generates the control magnetic field.

11. The fluid transport system of claim 1, wherein the one or more magnetic field generating devices comprise a toroidal magnetic device surrounding the MSM pipe.

12. The fluid transport system of claim 11, wherein the toroidal magnetic device is coupled to a linear translation device, the linear translation device configured to move the toroidal magnetic device along a length of the MSM pipe.

13. The fluid transport system of claim 1, further comprising a check valve fluidly coupled to the input end of the MSM pipe.

14. The fluid transport system of claim 1, further comprising a fluid source fluidly coupled to the input end of the MSM pipe.

15. A method of transporting fluid, the method comprising:

introducing a fluid into an input end of a magnetic shape memory (MSM) pipe, wherein:
the MSM pipe comprises the input end opposite an output end and an outer surface opposite an inner surface;
the inner surface defines an inner diameter of the MSM pipe; and
the MSM pipe comprises an MSM alloy; and
applying a control magnetic field to a first region of the MSM pipe such that the MSM alloy in the first region of the MSM pipe changes from a static state to a contracted state, thereby increasing the inner diameter of the first region of the MSM pipe from a first inner diameter to a second inner diameter and encouraging fluid flow from the input end of the MSM pipe toward the output end of the MSM pipe, wherein the control magnetic field is generated using one or more magnetic field generating devices surrounding the outer surface of the MSM pipe.

16. The method of claim 15, further comprising removing the control magnetic field from the first region of the MSM pipe such that the MSM alloy of the first region changes from the contracted state back to the static state thereby decreasing the inner diameter of the first region of the MSM pipe from the second inner diameter back to the first inner diameter.

17. The method of claim 15, further comprising, subsequent to removing the control magnetic field from the first region of the MSM pipe:
applying the control magnetic field to a second region of the MSM pipe such that the MSM alloy in the second region of the MSM pipe changes from the static state to the contracted state, thereby increasing the inner diameter of the second region of the MSM pipe from the first inner diameter to the second inner diameter and encouraging fluid flow from the input end of the MSM pipe toward the output end of the MSM pipe, wherein the second region is positioned between the first region and the output end of the MSM pipe.

18. The method of claim 17, wherein:
the one or more magnetic field generating devices comprise a plurality of wire coil sections wrapped around the MSM pipe and disposed along a length of the MSM pipe;
the plurality of wire coil sections include a first wire coil section wrapped around the first region of the MSM pipe and a second wire coil section wrapped around the second region of the MSM pipe;
applying the control magnetic field to the first region of the MSM pipe comprises applying a current to the first wire coil section such that the first wire coil section generates the control magnetic field, wherein the current is generated by one or more current sources electrically coupled to the plurality of wire coil sections; and
applying the control magnetic field to the second region of the MSM pipe comprises applying a current to the second wire coil section such that the second wire coil section generates the control magnetic field, wherein the current is generated by the one or more current sources electrically coupled to the plurality of wire coil sections.

19. The method of claim 17, wherein:
the one or more magnetic field generating devices comprise a toroidal magnetic device surrounding the MSM pipe;
applying the control magnetic field to the first region of the MSM pipe comprises positioning the toroidal magnetic device at the first region of the MSM pipe; and
applying the control magnetic field to the second region of the MSM pipe comprises translating the toroidal magnetic device from the first region of the MSM pipe to the second region of the MSM pipe.

20. The method of claim 15, wherein the MSM alloy comprises Ni—Mn—Ga.

* * * * *

UNITED STATES PATENT AND TRADEMARK OFFICE
CERTIFICATE OF CORRECTION

| | | |
|---|---|---|
| PATENT NO. | : 12,119,149 B2 | Page 1 of 1 |
| APPLICATION NO. | : 16/659833 | |
| DATED | : October 15, 2024 | |
| INVENTOR(S) | : Brian J. Pinkelman and Michael P. Rowe | |

It is certified that error appears in the above-identified patent and that said Letters Patent is hereby corrected as shown below:

In the Claims

In Column 10, Line(s) 40, Claim 8, delete "1s" and insert --is--, therefor.

Signed and Sealed this
Twenty-sixth Day of November, 2024

*Katherine Kelly Vidal*

Katherine Kelly Vidal
*Director of the United States Patent and Trademark Office*